United States Patent
Xu et al.

(10) Patent No.: US 10,121,506 B1
(45) Date of Patent: Nov. 6, 2018

(54) MAGNETIC-RECORDING MEDIUM INCLUDING A CARBON OVERCOAT IMPLANTED WITH NITROGEN AND HYDROGEN

(71) Applicant: WD Media, LLC, San Jose, CA (US)

(72) Inventors: Ge Xu, San Jose, CA (US); Xiaofeng Yao, San Jose, CA (US); Wei Kah Tan, San Jose, CA (US)

(73) Assignee: WD Media, LLC, San Jose, CA (US)

( * ) Notice: Subject to any disclaimer, the term of this patent is extended or adjusted under 35 U.S.C. 154(b) by 196 days.

(21) Appl. No.: 14/982,394

(22) Filed: Dec. 29, 2015

(51) Int. Cl.
*G11B 5/66* (2006.01)
*G11B 5/72* (2006.01)
*G11B 5/725* (2006.01)
*G11B 5/84* (2006.01)
*C23C 14/48* (2006.01)

(52) U.S. Cl.
CPC ............ *G11B 5/72* (2013.01); *C23C 14/48* (2013.01); *G11B 5/725* (2013.01); *G11B 5/8408* (2013.01)

(58) Field of Classification Search
CPC ............ G11B 5/72; G11B 5/725; G11B 5/722
See application file for complete search history.

(56) References Cited

U.S. PATENT DOCUMENTS

| | | |
|---|---|---|
| 6,013,161 A | 1/2000 | Chen et al. |
| 6,063,248 A | 5/2000 | Bourez et al. |
| 6,068,891 A | 5/2000 | O'Dell et al. |
| 6,086,730 A | 7/2000 | Liu |
| 6,099,981 A | 8/2000 | Nishimori |
| 6,103,404 A | 8/2000 | Ross et al. |
| 6,117,499 A | 9/2000 | Wong et al. |
| 6,136,403 A | 10/2000 | Prabhakara et al. |
| 6,143,375 A | 11/2000 | Ross et al. |
| 6,145,849 A | 11/2000 | Bae et al. |
| 6,146,737 A | 11/2000 | Malhotra et al. |
| 6,149,696 A | 11/2000 | Jia |
| 6,150,015 A | 11/2000 | Bertero et al. |
| 6,156,404 A | 12/2000 | Ross et al. |
| 6,159,076 A | 12/2000 | Sun et al. |
| 6,164,118 A | 12/2000 | Suzuki et al. |
| 6,200,441 B1 | 3/2001 | Gornicki et al. |
| 6,204,995 B1 | 3/2001 | Hokkyo et al. |
| 6,206,765 B1 | 3/2001 | Sanders et al. |
| 6,210,819 B1 | 4/2001 | Lal |
| 6,216,709 B1 | 4/2001 | Fung et al. |
| 6,221,119 B1 | 4/2001 | Homola |

(Continued)

*Primary Examiner* — Holly C Rickman
(74) *Attorney, Agent, or Firm* — Loza & Loza, LLP; Gabriel Fitch

(57) ABSTRACT

A magnetic-recording medium includes a hydrogen and nitrogen implanted carbon overcoat (HNICOC) on a magnetic-recording layer. The HNICOC includes nitrogen implanted in a top-surface layer of the HNICOC such that a percentage ratio of a concentration of the implanted nitrogen to a concentration of carbon is between about 30 percent (%) to about 10% within a depth from about 2 Ångstrom (Å) to about 5 Å from the top surface of the HNICOC. An amount of hydrogen implanted in the top-surface layer is between about 1% to about 12% within a distance less than about 5 Å from the top surface. A data storage device that incorporates the magnetic-recording medium within a magnetic-recording disk, and a method for making the magnetic-recording medium are also described.

14 Claims, 8 Drawing Sheets

(56) References Cited

U.S. PATENT DOCUMENTS

| | | | |
|---|---|---|---|
| 6,245,417 B1 | 6/2001 | Huang | |
| 6,248,395 B1 | 6/2001 | Homola et al. | |
| 6,261,681 B1 | 7/2001 | Suekane et al. | |
| 6,270,885 B1 | 8/2001 | Hokkyo et al. | |
| 6,274,063 B1 | 8/2001 | Li et al. | |
| 6,283,838 B1 | 9/2001 | Blake et al. | |
| 6,287,429 B1 | 9/2001 | Moroishi et al. | |
| 6,290,573 B1 | 9/2001 | Suzuki | |
| 6,299,947 B1 | 10/2001 | Suzuki et al. | |
| 6,303,217 B1 | 10/2001 | Malhotra et al. | |
| 6,309,765 B1 | 10/2001 | Suekane et al. | |
| 6,312,798 B1 * | 11/2001 | Ma | G11B 5/72 428/336 |
| 6,358,636 B1 | 3/2002 | Yang et al. | |
| 6,362,452 B1 | 3/2002 | Suzuki et al. | |
| 6,363,599 B1 | 4/2002 | Bajorek | |
| 6,365,012 B1 | 4/2002 | Sato et al. | |
| 6,381,090 B1 | 4/2002 | Suzuki et al. | |
| 6,381,092 B1 | 4/2002 | Suzuki | |
| 6,387,483 B1 | 5/2002 | Hokkyo et al. | |
| 6,391,213 B1 | 5/2002 | Homola | |
| 6,395,349 B1 | 5/2002 | Salamon | |
| 6,403,919 B1 | 6/2002 | Salamon | |
| 6,408,677 B1 | 6/2002 | Suzuki | |
| 6,426,157 B1 | 7/2002 | Hokkyo et al. | |
| 6,429,984 B1 | 8/2002 | Alex | |
| 6,482,330 B1 | 11/2002 | Bajorek | |
| 6,482,505 B1 | 11/2002 | Bertero et al. | |
| 6,500,567 B1 | 12/2002 | Bertero et al. | |
| 6,528,124 B1 | 3/2003 | Nguyen | |
| 6,548,821 B1 | 4/2003 | Treves et al. | |
| 6,552,871 B2 | 4/2003 | Suzuki et al. | |
| 6,565,719 B1 | 5/2003 | Lairson et al. | |
| 6,566,674 B1 | 5/2003 | Treves et al. | |
| 6,571,806 B2 | 6/2003 | Rosano et al. | |
| 6,628,466 B2 | 9/2003 | Alex | |
| 6,664,503 B1 | 12/2003 | Hsieh et al. | |
| 6,670,055 B2 | 12/2003 | Tomiyasu et al. | |
| 6,682,807 B2 | 1/2004 | Lairson et al. | |
| 6,683,754 B2 | 1/2004 | Suzuki et al. | |
| 6,730,420 B1 | 5/2004 | Bertero et al. | |
| 6,743,528 B2 | 6/2004 | Suekane et al. | |
| 6,759,138 B2 | 7/2004 | Tomiyasu et al. | |
| 6,778,353 B1 | 8/2004 | Harper | |
| 6,795,274 B1 | 9/2004 | Hsieh et al. | |
| 6,855,232 B2 | 2/2005 | Jairson et al. | |
| 6,857,937 B2 | 2/2005 | Bajorek | |
| 6,875,492 B1 * | 4/2005 | Pirzada | G11B 5/72 428/216 |
| 6,893,748 B2 | 5/2005 | Bertero et al. | |
| 6,899,959 B2 | 5/2005 | Bertero et al. | |
| 6,916,558 B2 | 7/2005 | Umezawa et al. | |
| 6,939,120 B1 | 9/2005 | Harper | |
| 6,946,191 B2 | 9/2005 | Morikawa et al. | |
| 6,967,798 B2 | 11/2005 | Homola et al. | |
| 6,972,135 B2 | 12/2005 | Homola | |
| 7,004,827 B1 | 2/2006 | Suzuki et al. | |
| 7,006,323 B1 | 2/2006 | Suzuki | |
| 7,016,154 B2 | 3/2006 | Nishihira | |
| 7,019,924 B2 | 3/2006 | McNeil et al. | |
| 7,045,215 B2 | 5/2006 | Shimokawa | |
| 7,070,870 B2 | 7/2006 | Bertero et al. | |
| 7,090,934 B2 | 8/2006 | Hokkyo et al. | |
| 7,099,112 B1 | 8/2006 | Harper | |
| 7,105,241 B2 | 9/2006 | Shimokawa et al. | |
| 7,119,990 B2 | 10/2006 | Bajorek et al. | |
| 7,147,790 B2 | 12/2006 | Wachenschwanz et al. | |
| 7,161,753 B2 | 1/2007 | Wachenschwanz et al. | |
| 7,166,319 B2 | 1/2007 | Ishiyama | |
| 7,166,374 B2 | 1/2007 | Suekane et al. | |
| 7,169,487 B2 | 1/2007 | Kawai et al. | |
| 7,174,775 B2 | 2/2007 | Ishiyama | |
| 7,179,549 B2 | 2/2007 | Malhotra et al. | |
| 7,184,139 B2 | 2/2007 | Treves et al. | |
| 7,196,860 B2 | 3/2007 | Alex | |
| 7,199,977 B2 | 4/2007 | Suzuki et al. | |
| 7,208,236 B2 | 4/2007 | Morikawa et al. | |
| 7,220,500 B1 | 5/2007 | Tomiyasu et al. | |
| 7,229,266 B2 | 6/2007 | Harper | |
| 7,239,970 B2 | 7/2007 | Treves et al. | |
| 7,252,897 B2 | 8/2007 | Shimokawa et al. | |
| 7,277,254 B2 | 10/2007 | Shimokawa et al. | |
| 7,281,920 B2 | 10/2007 | Homola et al. | |
| 7,292,329 B2 | 11/2007 | Treves et al. | |
| 7,301,726 B1 | 11/2007 | Suzuki | |
| 7,302,148 B2 | 11/2007 | Treves et al. | |
| 7,305,119 B2 | 12/2007 | Treves et al. | |
| 7,314,404 B2 | 1/2008 | Singh et al. | |
| 7,320,584 B1 | 1/2008 | Harper et al. | |
| 7,329,114 B2 | 2/2008 | Harper et al. | |
| 7,375,362 B2 | 5/2008 | Treves et al. | |
| 7,420,886 B2 | 9/2008 | Tomiyasu et al. | |
| 7,425,719 B2 | 9/2008 | Treves et al. | |
| 7,471,484 B2 | 12/2008 | Wachenschwanz et al. | |
| 7,498,062 B2 | 3/2009 | Calcaterra et al. | |
| 7,531,485 B2 | 5/2009 | Hara et al. | |
| 7,537,846 B2 | 5/2009 | Ishiyama et al. | |
| 7,549,209 B2 | 6/2009 | Wachenschwanz et al. | |
| 7,569,490 B2 | 8/2009 | Staud | |
| 7,597,792 B2 | 10/2009 | Homola et al. | |
| 7,597,973 B2 | 10/2009 | Ishiyama | |
| 7,608,193 B2 | 10/2009 | Wachenschwanz et al. | |
| 7,632,087 B2 | 12/2009 | Homola | |
| 7,656,615 B2 | 2/2010 | Wachenschwanz et al. | |
| 7,682,546 B2 | 3/2010 | Harper | |
| 7,684,152 B2 | 3/2010 | Suzuki et al. | |
| 7,686,606 B2 | 3/2010 | Harper et al. | |
| 7,686,991 B2 | 3/2010 | Harper | |
| 7,695,833 B2 | 4/2010 | Ishiyama | |
| 7,722,968 B2 | 5/2010 | Ishiyama | |
| 7,733,605 B2 | 6/2010 | Suzuki et al. | |
| 7,736,768 B2 | 6/2010 | Ishiyama | |
| 7,755,861 B1 | 7/2010 | Li et al. | |
| 7,758,732 B1 | 7/2010 | Calcaterra et al. | |
| 7,833,639 B2 | 11/2010 | Sonobe et al. | |
| 7,833,641 B2 | 11/2010 | Tomiyasu et al. | |
| 7,910,159 B2 | 3/2011 | Jung | |
| 7,911,736 B2 | 3/2011 | Bajorek | |
| 7,924,519 B2 | 4/2011 | Lambert | |
| 7,931,748 B2 | 4/2011 | Veerasamy et al. | |
| 7,944,165 B1 | 5/2011 | O'Dell | |
| 7,944,643 B1 | 5/2011 | Jiang et al. | |
| 7,955,723 B2 | 6/2011 | Umezawa et al. | |
| 7,983,003 B2 | 7/2011 | Sonobe et al. | |
| 7,993,497 B2 | 8/2011 | Moroishi et al. | |
| 7,993,765 B2 | 8/2011 | Kim et al. | |
| 7,998,912 B2 | 8/2011 | Chen et al. | |
| 8,002,901 B1 | 8/2011 | Chen et al. | |
| 8,003,237 B2 | 8/2011 | Sonobe et al. | |
| 8,012,920 B2 | 9/2011 | Shimokawa | |
| 8,038,863 B2 | 10/2011 | Homola | |
| 8,057,926 B2 | 11/2011 | Ayama et al. | |
| 8,062,778 B2 | 11/2011 | Suzuki et al. | |
| 8,064,156 B1 | 11/2011 | Suzuki et al. | |
| 8,076,013 B2 | 12/2011 | Sonobe et al. | |
| 8,092,931 B2 | 1/2012 | Ishiyama et al. | |
| 8,100,685 B1 | 1/2012 | Harper et al. | |
| 8,101,054 B2 | 1/2012 | Chen et al. | |
| 8,125,723 B1 | 2/2012 | Nichols et al. | |
| 8,125,724 B1 | 2/2012 | Nichols et al. | |
| 8,137,517 B1 | 3/2012 | Bourez | |
| 8,142,916 B2 | 3/2012 | Umezawa et al. | |
| 8,163,093 B1 | 4/2012 | Chen et al. | |
| 8,171,949 B1 | 5/2012 | Lund et al. | |
| 8,173,282 B1 | 5/2012 | Sun et al. | |
| 8,178,480 B2 | 5/2012 | Hamakubo et al. | |
| 8,206,789 B2 | 6/2012 | Suzuki | |
| 8,218,260 B2 | 7/2012 | Iamratanakul et al. | |
| 8,247,095 B2 | 8/2012 | Champion et al. | |
| 8,257,783 B2 | 9/2012 | Suzuki et al. | |
| 8,298,609 B1 | 10/2012 | Liew et al. | |
| 8,298,689 B2 | 10/2012 | Sonobe et al. | |
| 8,309,239 B2 | 11/2012 | Umezawa et al. | |
| 8,316,668 B1 | 11/2012 | Chan et al. | |

(56) References Cited

U.S. PATENT DOCUMENTS

| | | |
|---|---|---|
| 8,331,056 B2 | 12/2012 | O'Dell |
| 8,354,618 B1 | 1/2013 | Chen et al. |
| 8,367,228 B2 | 2/2013 | Sonobe et al. |
| 8,383,209 B2 | 2/2013 | Ayama |
| 8,394,243 B1 | 3/2013 | Jung et al. |
| 8,397,751 B1 | 3/2013 | Chan et al. |
| 8,399,809 B1 | 3/2013 | Bourez |
| 8,402,638 B1 | 3/2013 | Treves et al. |
| 8,404,056 B1 | 3/2013 | Chen et al. |
| 8,404,369 B2 | 3/2013 | Ruffini et al. |
| 8,404,370 B2 | 3/2013 | Sato et al. |
| 8,406,918 B2 | 3/2013 | Tan et al. |
| 8,414,966 B2 | 4/2013 | Yasumori et al. |
| 8,425,975 B2 | 4/2013 | Ishiyama |
| 8,431,257 B2 | 4/2013 | Kim et al. |
| 8,431,258 B2 | 4/2013 | Onoue et al. |
| 8,453,315 B2 | 6/2013 | Kajiwara et al. |
| 8,488,276 B1 | 7/2013 | Jung et al. |
| 8,491,800 B1 | 7/2013 | Dorsey |
| 8,492,009 B1 | 7/2013 | Homola et al. |
| 8,492,011 B2 | 7/2013 | Itoh et al. |
| 8,496,466 B1 | 7/2013 | Treves et al. |
| 8,517,364 B1 | 8/2013 | Crumley et al. |
| 8,517,657 B2 | 8/2013 | Chen et al. |
| 8,518,563 B2 | 8/2013 | Jones et al. |
| 8,524,052 B1 | 9/2013 | Tan et al. |
| 8,530,065 B1 | 9/2013 | Chernyshov et al. |
| 8,546,000 B2 | 10/2013 | Umezawa |
| 8,551,253 B2 | 10/2013 | Na'im et al. |
| 8,551,627 B2 | 10/2013 | Shimada et al. |
| 8,556,566 B1 | 10/2013 | Suzuki et al. |
| 8,559,131 B2 | 10/2013 | Masuda et al. |
| 8,562,748 B1 | 10/2013 | Chen et al. |
| 8,565,050 B1 | 10/2013 | Bertero et al. |
| 8,570,844 B1 | 10/2013 | Yuan et al. |
| 8,580,410 B2 | 11/2013 | Onoue |
| 8,584,687 B1 | 11/2013 | Chen et al. |
| 8,591,709 B1 | 11/2013 | Lim et al. |
| 8,592,061 B2 | 11/2013 | Onoue et al. |
| 8,596,287 B1 | 12/2013 | Chen et al. |
| 8,597,723 B1 | 12/2013 | Jung et al. |
| 8,603,649 B2 | 12/2013 | Onoue |
| 8,603,650 B2 | 12/2013 | Sonobe et al. |
| 8,605,388 B2 | 12/2013 | Yasumori et al. |
| 8,605,555 B1 | 12/2013 | Chernyshov et al. |
| 8,608,147 B1 | 12/2013 | Yap et al. |
| 8,609,263 B1 | 12/2013 | Chernyshov et al. |
| 8,619,381 B2 | 12/2013 | Moser et al. |
| 8,623,528 B2 | 1/2014 | Umezawa et al. |
| 8,623,529 B2 | 1/2014 | Suzuki |
| 8,634,155 B2 | 1/2014 | Yasumori et al. |
| 8,658,003 B1 | 2/2014 | Bourez |
| 8,658,292 B1 | 2/2014 | Mallary et al. |
| 8,665,541 B2 | 3/2014 | Saito |
| 8,668,953 B1 | 3/2014 | Buechel-Rimmel |
| 8,674,327 B1 | 3/2014 | Poon et al. |
| 8,685,214 B1 | 4/2014 | Moh et al. |
| 8,696,404 B2 | 4/2014 | Sun et al. |
| 8,711,499 B1 | 4/2014 | Desai et al. |
| 8,743,666 B1 | 6/2014 | Bertero et al. |
| 8,758,912 B2 | 6/2014 | Srinivasan et al. |
| 8,787,124 B1 | 7/2014 | Chernyshov et al. |
| 8,787,130 B1 | 7/2014 | Yuan et al. |
| 8,791,391 B2 | 7/2014 | Bourez |
| 8,795,765 B2 | 8/2014 | Koike et al. |
| 8,795,790 B2 | 8/2014 | Sonobe et al. |
| 8,795,857 B2 | 8/2014 | Ayama et al. |
| 8,800,322 B1 | 8/2014 | Chan et al. |
| 8,811,129 B1 | 8/2014 | Yuan et al. |
| 8,817,410 B1 | 8/2014 | Moser et al. |
| 9,524,742 B2* | 12/2016 | Hayakawa ............... G11B 5/72 |
| 2002/0060883 A1 | 5/2002 | Suzuki |
| 2003/0022024 A1 | 1/2003 | Wachenswanz |
| 2004/0022387 A1 | 2/2004 | Weikle |
| 2004/0132301 A1 | 7/2004 | Harper et al. |
| 2004/0202793 A1 | 10/2004 | Harper et al. |
| 2004/0202865 A1 | 10/2004 | Homola et al. |
| 2004/0209123 A1 | 10/2004 | Bajorek et al. |
| 2004/0209470 A1 | 10/2004 | Bajorek |
| 2005/0036223 A1 | 2/2005 | Wachenschwanz et al. |
| 2005/0142990 A1 | 6/2005 | Homola |
| 2005/0150862 A1 | 7/2005 | Harper et al. |
| 2005/0151282 A1 | 7/2005 | Harper et al. |
| 2005/0151283 A1 | 7/2005 | Bajorek et al. |
| 2005/0151300 A1 | 7/2005 | Harper et al. |
| 2005/0155554 A1 | 7/2005 | Saito |
| 2005/0167867 A1 | 8/2005 | Bajorek et al. |
| 2005/0263401 A1 | 12/2005 | Olsen et al. |
| 2006/0147758 A1 | 7/2006 | Jung et al. |
| 2006/0181697 A1 | 8/2006 | Treves et al. |
| 2006/0207890 A1 | 9/2006 | Staud |
| 2007/0070549 A1 | 3/2007 | Suzuki et al. |
| 2007/0245909 A1 | 10/2007 | Homola |
| 2008/0075845 A1 | 3/2008 | Sonobe et al. |
| 2008/0093760 A1 | 4/2008 | Harper et al. |
| 2009/0117408 A1 | 5/2009 | Umezawa et al. |
| 2009/0136784 A1 | 5/2009 | Suzuki et al. |
| 2009/0169922 A1 | 7/2009 | Ishiyama |
| 2009/0191331 A1 | 7/2009 | Umezawa et al. |
| 2009/0202866 A1 | 8/2009 | Kim et al. |
| 2009/0311557 A1 | 12/2009 | Onoue et al. |
| 2009/0317663 A1 | 12/2009 | Kong et al. |
| 2010/0143752 A1 | 6/2010 | Ishibashi et al. |
| 2010/0190035 A1 | 7/2010 | Sonobe et al. |
| 2010/0196619 A1 | 8/2010 | Ishiyama |
| 2010/0196740 A1 | 8/2010 | Ayama et al. |
| 2010/0209601 A1 | 8/2010 | Shimokawa et al. |
| 2010/0215992 A1 | 8/2010 | Horikawa et al. |
| 2010/0232065 A1 | 9/2010 | Suzuki et al. |
| 2010/0247965 A1 | 9/2010 | Onoue |
| 2010/0261039 A1 | 10/2010 | Itoh et al. |
| 2010/0279151 A1 | 11/2010 | Sakamoto et al. |
| 2010/0300884 A1 | 12/2010 | Homola et al. |
| 2010/0304186 A1 | 12/2010 | Shimokawa |
| 2011/0097603 A1 | 4/2011 | Onoue |
| 2011/0097604 A1 | 4/2011 | Onoue |
| 2011/0171495 A1 | 7/2011 | Tachibana et al. |
| 2011/0206947 A1 | 8/2011 | Tachibana et al. |
| 2011/0212346 A1 | 9/2011 | Onoue et al. |
| 2011/0223446 A1 | 9/2011 | Onoue et al. |
| 2011/0244119 A1 | 10/2011 | Umezawa et al. |
| 2011/0299194 A1 | 12/2011 | Aniya et al. |
| 2011/0311841 A1 | 12/2011 | Saito et al. |
| 2012/0069466 A1 | 3/2012 | Okamoto et al. |
| 2012/0070692 A1 | 3/2012 | Sato et al. |
| 2012/0077060 A1 | 3/2012 | Ozawa |
| 2012/0127599 A1 | 5/2012 | Shimokawa et al. |
| 2012/0127601 A1 | 5/2012 | Suzuki et al. |
| 2012/0129009 A1 | 5/2012 | Sato et al. |
| 2012/0140359 A1 | 6/2012 | Tachibana |
| 2012/0141833 A1 | 6/2012 | Umezawa et al. |
| 2012/0141835 A1 | 6/2012 | Sakamoto |
| 2012/0148875 A1 | 6/2012 | Hamakubo et al. |
| 2012/0156523 A1 | 6/2012 | Seki et al. |
| 2012/0164488 A1 | 6/2012 | Shin et al. |
| 2012/0170152 A1 | 7/2012 | Sonobe et al. |
| 2012/0171369 A1 | 7/2012 | Koike et al. |
| 2012/0175243 A1 | 7/2012 | Fukuura et al. |
| 2012/0189872 A1 | 7/2012 | Umezawa et al. |
| 2012/0196049 A1 | 8/2012 | Azuma et al. |
| 2012/0207919 A1 | 8/2012 | Sakamoto et al. |
| 2012/0225217 A1 | 9/2012 | Itoh et al. |
| 2012/0251842 A1 | 10/2012 | Yuan et al. |
| 2012/0251846 A1 | 10/2012 | Desai et al. |
| 2012/0276417 A1 | 11/2012 | Shimokawa et al. |
| 2012/0308722 A1 | 12/2012 | Suzuki et al. |
| 2013/0040167 A1 | 2/2013 | Alagarsamy et al. |
| 2013/0071694 A1 | 3/2013 | Srinivasan et al. |
| 2013/0165029 A1 | 6/2013 | Sun et al. |
| 2013/0175252 A1 | 7/2013 | Bourez |
| 2013/0216865 A1 | 8/2013 | Yasumori et al. |
| 2013/0230647 A1 | 9/2013 | Onoue et al. |
| 2013/0314815 A1 | 11/2013 | Yuan et al. |
| 2014/0011054 A1 | 1/2014 | Suzuki |

(56) References Cited

U.S. PATENT DOCUMENTS

| | | |
|---|---|---|
| 2014/0044992 A1 | 2/2014 | Onoue |
| 2014/0050843 A1 | 2/2014 | Yi et al. |
| 2014/0151360 A1 | 6/2014 | Gregory et al. |
| 2014/0234666 A1 | 8/2014 | Knigge et al. |

* cited by examiner

MAGNETIC-RECORDING MEDIUM INCLUDING A CARBON OVERCOAT IMPLANTED WITH NITROGEN AND HYDROGEN

BACKGROUND

In the manufacture of magnetic-recording media for data storage devices, for example, magnetic-recording disks of hard-disk drives, a carbon overcoat (COC) may be used to protect the magnetic-recording medium. Nitrogen implantation of the COC results in the formation of a thin top-surface layer of nitrogenated carbon in proximity to the surface of the nitrogen-implanted COC (NICOC). The thin top-surface layer of nitrogenated carbon can promote bonding between the NICOC and a layer added later on top of the NICOC, by way of example, a layer of lubricant, without limitation thereto.

DETAILED DESCRIPTION

Figure 1:
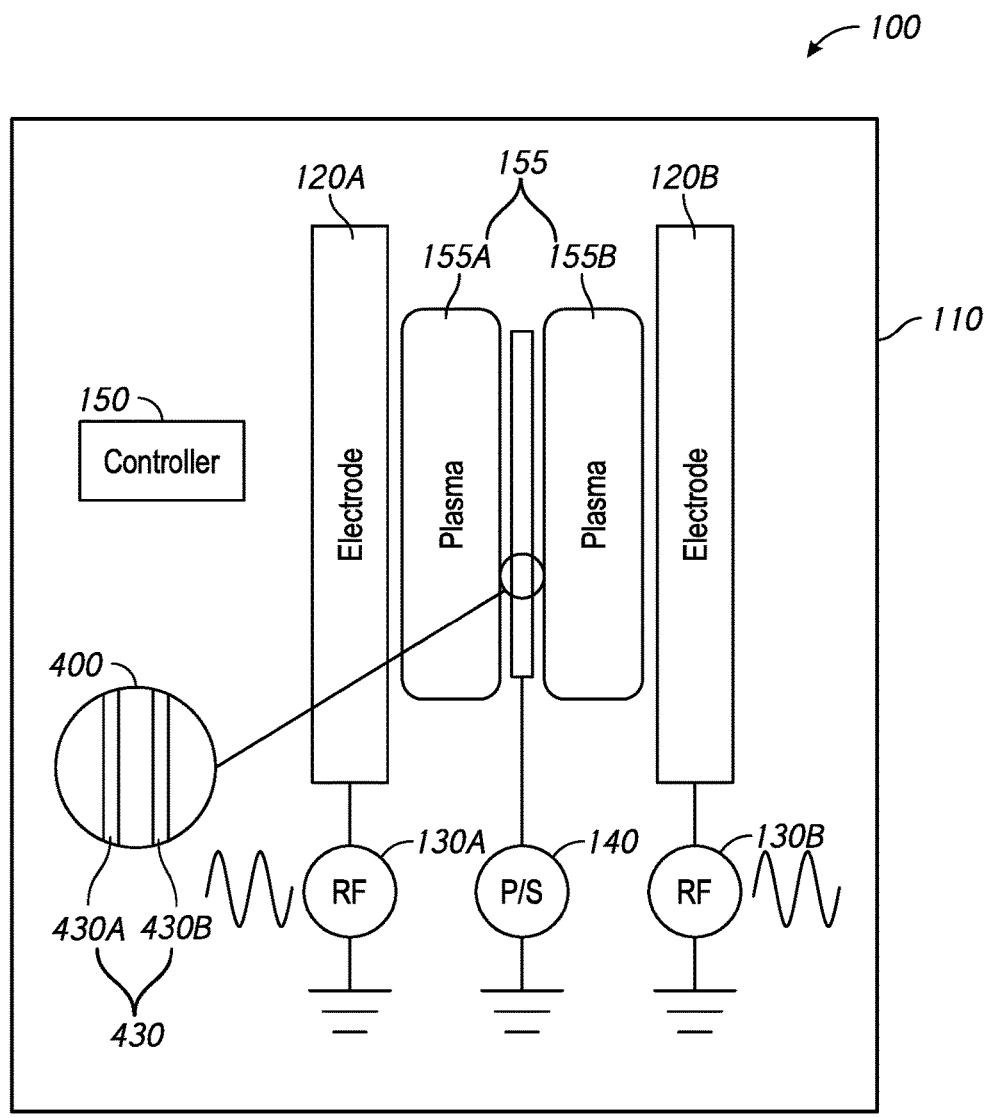
FIG. 1 is a schematic drawing, by way of example without limitation thereto, of an apparatus configured to perform combined hydrogen and nitrogen implantation of a magnetic-recording medium for use in a data storage device, according to an embodiment.

Low-damage and high-efficiency nitrogen implantation processes can be used to implant nitrogen during the fabrication of a magnetic-recording medium. These nitrogen implantation processes can be applied in the post-deposition treatment of a carbon overcoat (COC) of a magnetic-recording medium for use in a data storage device, such as—by way of example and without limitation thereto—a hard-disk drive (HDD) or solid state hybrid drive (SSHD). The nitrogen implantation process results in plasma-induced damage in the form of dangling bonds in a nitrogen-implanted carbon overcoat (NICOC) that coats the magnetic-recording medium. These dangling bonds in the NICOC behave as active sites for the bonding of a layer of lubricant later applied to a magnetic-recording disk that includes the magnetic-recording medium. Unfortunately, although such active sites can improve the bonding of lubricant to the NICOC of the magnetic-recording medium, active sites in the NICOC can also bond adventitious contaminants to the disk surface that are present in the environment. These adventitious contaminants, of which silanes, being amongst the most deleterious, are but one example, can be picked up by and accumulated on the magnetic-recording head and cause fly-height instabilities that affect the signal-to-noise ratio of information read back from the magnetic-recording disk. According to an embodiment, an amount of hydrogen may be added to the nitrogen gas flow that is used to implant nitrogen into a top-surface layer of the COC. According to an embodiment, some of the hydrogen added to the gas flow is implanted along with the nitrogen into the top-surface layer of the COC; and, the hydrogen thus implanted is sufficient to inactivate a first fraction of active sites created by the implanted nitrogen to inhibit contamination from adventitious contaminants in the environment.

According to an embodiment, by way of example without limitation thereto, the combined hydrogen and nitrogen implantation process may utilize dual radio frequency (RF) powered electrodes to generate a high density hydrogen and nitrogen plasma to form a hydrogen and nitrogen implanted carbon overcoat (HNICOC) that coats the magnetic-recording medium. The high density hydrogen and nitrogen plasma is generated and controlled with a controlled percentage ratio of the hydrogen gas flow rate to the total gas flow rate, with gas pressure within the implantation chamber, with substrate electrical biasing, and with time duration of the implantation. As used herein, hydrogen gas means molecular hydrogen, $H_2$, gas; and, nitrogen gas means molecular nitrogen, $N_2$, gas. According to an embodiment, the total gas includes substantially hydrogen gas and nitrogen gas, so that the total gas flow rate is substantially the sum of the hydrogen gas flow rate and the nitrogen gas flow rate, without limitation thereto, as other gaseous species may be present in the gas flow depending on the purity of the $H_2$ gas, the purity of the $N_2$ gas, and the addition of other gases to the gas flow mixture. The combined hydrogen and nitrogen implantation process can improve bonding of a layer of lubricant to the magnetic-recording medium, while reducing the amount of adventitious contaminants accumulated from the environment, by way of example without limitation thereto, silanes. Also, high efficiency nitrogen incorporation can be achieved, while also minimizing film-thickness increase and plasma damage caused by ion bombardment. In various embodiments, the combined hydrogen and nitrogen implantation process can be performed with various gases (e.g., $N_2$, $H_2$, and $NH_3$) for the post-deposition treatment of the COC of the magnetic-recording medium.

With reference now to FIG. 1, according to an embodiment, a schematic drawing is shown, by way of example without limitation thereto, of an apparatus 100 configured to perform combined hydrogen and nitrogen implantation of a magnetic-recording medium 400. As shown in FIG. 1, the apparatus 100 may include dual RF-powered electrodes that include a first electrode 120A and a second electrode 120B, according to an embodiment. The apparatus 100 can achieve high nitrogenation efficiency while causing minimum plasma damage to the HNICOC 430 of the magnetic-recording medium 400, for example, a first HNICOC 430A and a second HNICOC 430B on opposite sides of the magnetic-recording medium 400, and minimum film-thickness increase to about 1 Angstrom (Å) to 2 Å. As used herein, the term of art, HNICOC 430, may refer to at least one of the first HNICOC 430A and the second HNICOC 430B, and the magnetic-recording medium 400 may be incorporated in a magnetic-recording disk 910 (see FIG. 9), by way of example without limitation thereto. The nitrogenation efficiency can be characterized by a nitrogen-to-carbon (N/C) percentage ratio for the implanted area that is produced during a preselected time duration of the implantation process. In one embodiment, the improved nitrogen implantation process can achieve an N/C percentage ratio of between about 15 to 30 percent (%) within a time duration of about 2.6 seconds, or less.

As used herein, the term of art, "percentage ratio," is defined as the ratio of two quantities expressed as a percentage. For example, the percentage ratio of the concentration of nitrogen to the concentration of carbon, referred to herein as the N/C percentage ratio, in the surface layer 434 (see FIG. 4) of the HNICOC 430, is the ratio of the atomic percentage of nitrogen to the atomic percentage of carbon expressed as a percentage. Similarly, the percentage ratio of the hydrogen gas flow rate to the total gas flow rate is the ratio of the hydrogen gas flow rate to the total gas flow rate expressed as a percentage. For example, certain percentage ratios of the hydrogen gas flow rate to the total gas flow rate of 0%, 4%, 7%, 10% and 15% are described herein. These percentage ratios of the hydrogen gas flow rate to the total gas flow rate correspond to, by way of example without limitation thereto, the following ratios of the hydrogen gas flow rate to the total gas flow rate expressed as a percentage, viz.: 0 sccm/600 sccm, 24 sccm/600 sccm, 42 sccm/600 sccm, 60 sccm/600 sccm and 90 sccm/600 sccm, respectively, where sccm is an acronym for standard cubic centimeters per minute.

With further reference to FIG. 1, by way of example without limitation thereto, the plasma 155, including at least one of the RF-generated first plasma portion 155A and the RF-generated second plasma portion 155B, may be used to perform the combined hydrogen and nitrogen implantation of HNICOC 430 disposed on at least one of both respective sides of the magnetic-recording medium 400 inside an implantation chamber 110, for example, a vacuum chamber. It will be recognized that the drawing of FIG. 1 represents a schematic, cross-sectional view of the implantation chamber 110; and, therefore, the plasma 155 actually wraps around the magnetic-recording medium 400 and includes the RF-generated first plasma portion 155A and the RF-generated second plasma portion 155B as shown in FIG. 1; and, as used herein, the term of art "plasma 155," may refer to either one or both of the RF-generated first plasma portion 155A and the RF-generated second plasma portion 155B. As shown in FIG. 1, the RF-generated first plasma portion 155A is generated between a first electrode 120A and the magnetic-recording medium 400; and, the RF-generated second plasma portion 155B is generated between a second electrode 120B and the magnetic-recording medium 400. As shown in FIG. 1, according to an embodiment, by way of example without limitation thereto, the magnetic-recording medium 400 is shown as double-sided, as for a magnetic-recording disk 910 (see FIG. 9) that incorporates the magnetic-recording medium 400. However, according to another embodiment, the magnetic-recording medium 400 may be single-sided, as for a single-sided magnetic-recording tape that incorporates the magnetic-recording medium 400. Although the apparatus 100 shown in FIG. 1 has first and second electrodes 120A and 120B, as well as RF-generated first and second plasma portions 155A and 155B, positioned on opposite sides of the magnetic-recording medium 400, this is by way of example without limitation thereto, as an apparatus with a single electrode and a single RF-generated plasma is also within the spirit and scope of embodiments described herein. First and second RF-power generators 130A and 130B may be coupled to and drive each of the two electrodes 120A and 120B, respectively, with a preselected amount of RF power, while the magnetic-recording medium 400 between the electrodes 120A and 120B may be biased with a bias voltage, for example, a DC voltage from a power supply (P/S) 140. In an embodiment, the apparatus 100 may have a controller 150 that is operatively coupled with the implantation chamber 110 and the electrodes 120A and 120B. In various embodiments, the controller 150 may be located inside or outside of the implantation chamber 110.

In an embodiment, a middle portion, for example, a disk-shaped or a cylindrical-shaped portion, of an electrode 120A-120B facing the magnetic-recording medium 400 may have a substantially flat surface. In the related art, the corresponding portion of the electrode is generally not substantially flat and, for example, may have rounded edges, or may include a protrusion and, for example, may be convex in shape. In one embodiment, the substantially flat surface of the middle portion of the electrode may have one or more holes for receiving a fastener therein. In such case, an exposed portion of the fastener, for example, a head of a bolt or screw, facing the substrate may be substantially flat and recessed into the middle portion of the electrode. In another embodiment, the electrode has a tapered ring portion surrounding the middle portion of the electrode. The tapered ring portion may have a substantially regular cylindrical shape (e.g., substantially symmetrical) with sharp edges. In the related art, the tapered ring portion can be asymmetrical in shape and the edges may be rounded.

Figure 2:
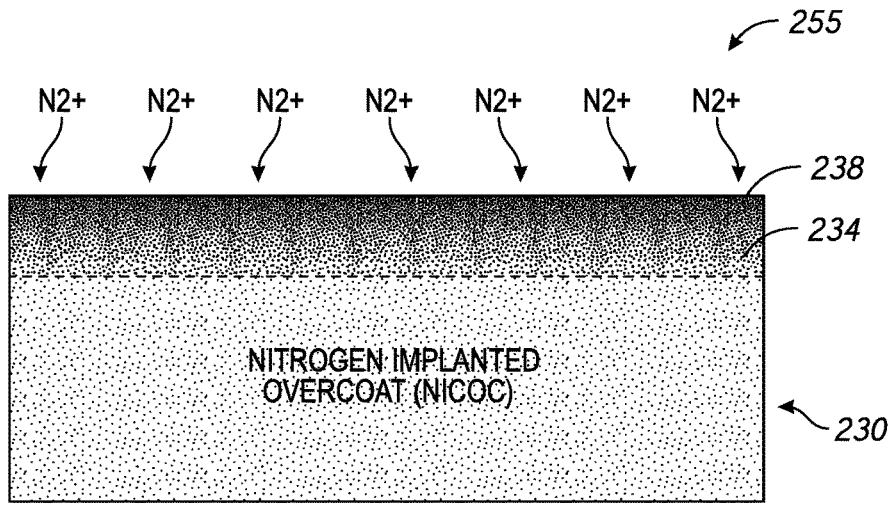
FIG. 2 is a schematic drawing, according to a prior-art method, of a prior-art, nitrogen-implanted carbon overcoat (NICOC) of a prior-art, magnetic-recording medium including a nitrogen-implanted, top-surface layer produced by nitrogen implantation.

With reference now to FIG. 2, according to a prior-art method, a schematic drawing is shown of a prior-art, nitrogen-implanted carbon overcoat (NICOC) 230 of a prior-art, magnetic-recording medium (not shown). The prior-art NICOC 230 includes a prior-art, nitrogen-implanted, top-surface layer 234 produced by nitrogen implantation in proximity to the top surface 238 of NICOC 230. Molecular nitrogen ions ($N_2+$) 255 are produced in a prior-art, nitrogen implantation process to form a nitrogen-implanted, top-surface layer 234 of the NICOC 230. The nitrogen-implanted, top-surface layer 234 helps to bond lubricant (not shown) to the magnetic-recording medium. According to the prior art method, nitrogen gas is introduced to into an implantation chamber; and a molecular nitrogen plasma including the molecular nitrogen ions ($N_2+$) 255 are produced by RF discharge. Molecular nitrogen ions ($N_2+$) 255 are accelerated toward the magnetic-recording medium by the electrical potential difference between the magnetic-recording medium and the plasma, which is produced by the combined effect of a bias voltage applied to the magnetic-recording medium, if any, and a plasma potential, and implanted into a COC of the magnetic-recording medium. Note that, prior to implantation, the layer labeled as nitrogen implanted carbon overcoat NICOC 230 in FIG. 2 may comprise an unimplanted COC prior to transformation of the unimplanted COC into the NICOC 230 by nitrogen implantation. As a result, a nitrogenized carbon layer is formed in the COC of the magnetic-recording medium producing a nitrogen-implanted, top-surface layer 234 of the NICOC 230. This nitrogenized carbon layer is used to enhance bonding with a layer of the lubricant. However, the nitrogen implantation process generates film defects, by way of example without limitation thereto, dangling bonds, in the nitrogen-implanted, top-surface layer 234 of the NICOC 230. These dangling bonds are relatively active and provide active sites that can also easily bond with contaminants in the environment and may cause tribology-related issues during operation of a data storage device, by way of example without limitation thereto, a hard-disk drive.

Figure 3:
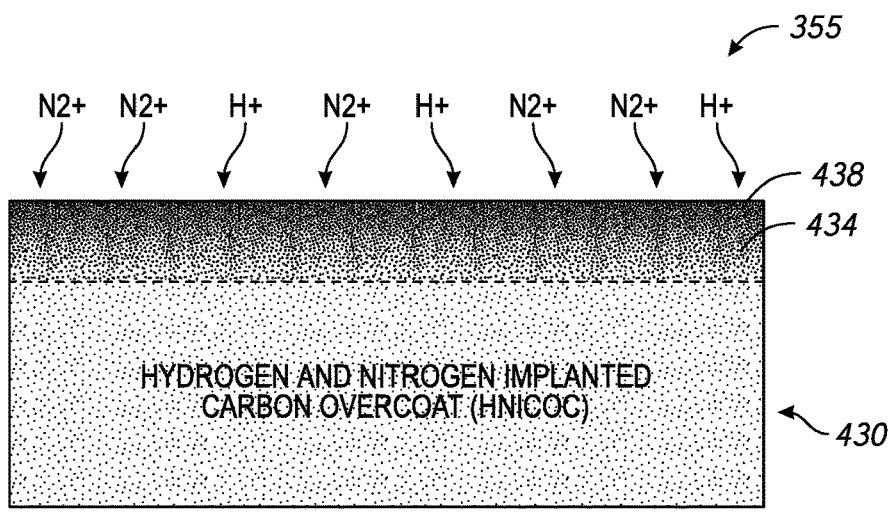
FIG. 3 is a schematic drawing of a hydrogen and nitrogen implanted carbon overcoat (HNICOC) of a magnetic-recording medium including a nitrogen-implanted, hydrogen-implanted, top-surface layer produced by combined hydrogen and nitrogen implantation, according to an embodiment.
Figure 4:
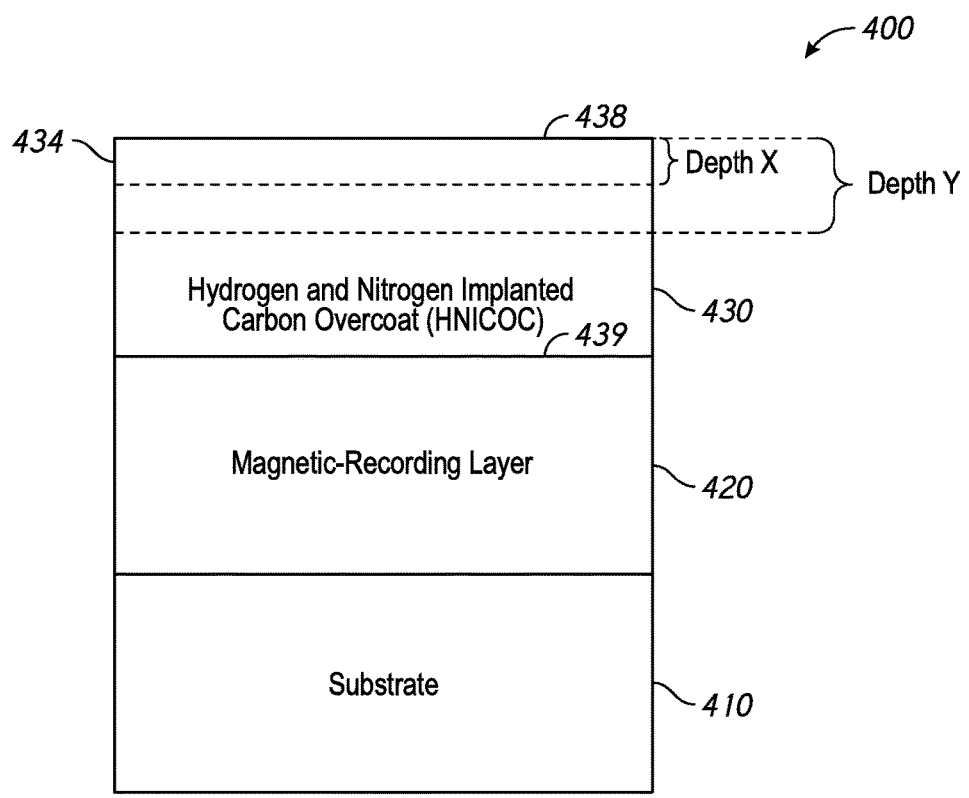
FIG. 4 is a schematic drawing of a magnetic-recording medium including a substrate, a magnetic-recording layer and the HNICOC that illustrates the structure of the top-surface layer of the HNICOC, according to an embodiment.

With reference now to FIG. 3, according to an embodiment, a schematic drawing is shown of the hydrogen and nitrogen implanted carbon overcoat (HNICOC) 430 of a magnetic-recording medium 400 (see FIGS. 1 and 4). The HNICOC 430 includes a nitrogen-implanted, hydrogen-implanted, top-surface layer 434 produced by combined hydrogen and nitrogen implantation in proximity to the top surface 438 of HNICOC 430. According to an embodiment, a mixture 355 of molecular nitrogen ions ($N_2+$) and hydrogen ions (H+) are produced in the combined hydrogen and nitrogen implantation process as the dominant implanting species, without limitation thereto, as the mixture 355 may also include other ionic species, such as, monatomic nitrogen ions (N+) and molecular hydrogen ions ($H_2+$). However, upon implantation into the HNICOC, it might be expected that the molecular species, viz., molecular nitrogen ions ($N_2+$) and molecular hydrogen ions ($H_2+$), would dissociate primarily into the monatomic ionic species, such as, monatomic nitrogen ions (N+) and monatomic hydrogen ions (H+), respectively. According to an embodiment, nitrogen and additional hydrogen gas are introduced to the implantation chamber 110 (see FIG. 1). By way of example, according to an embodiment as described above (see FIG. 1), a mixed hydrogen and nitrogen (H/N) plasma is produced by RF discharge, without limitation thereto, as embodiments include other means for implanting molecular nitrogen ions ($N_2+$) and hydrogen ions (H+). The mixture 355 of molecular nitrogen ions ($N_2+$) and hydrogen ions (H+) is accelerated toward the magnetic-recording medium 400 by the electrical potential difference between the magnetic-recording medium 400 and the plasma 155 (see FIG. 1), which is produced by the combined effect of a bias voltage applied to the magnetic-recording medium 400, if any, and a plasma potential, and implanted into a COC of the magnetic-recording medium 400, which, by way of example without limitation thereto, may not be implanted initially. Note that, prior to implantation, the layer labeled as HNICOC 430 in FIG. 3 may comprise an unimplanted COC prior to transformation of the unimplanted COC into the HNICOC 430 by combined hydrogen and nitrogen implantation. As a result, a nitrogenized carbon layer with hydrogen doping is formed in the HNICOC 430 of the magnetic-recording medium producing a hydrogen and nitrogen implanted, top-surface layer 434 of the HNICOC 430.

With reference now to FIG. 4, according to an embodiment, a schematic drawing is shown of a magnetic-recording medium 400. As shown in FIG. 4, the magnetic-recording medium 400 includes a substrate 410, a magnetic-recording layer 420 disposed on the substrate 410, and the HNICOC 430 disposed on the magnetic-recording layer 420, by way of example without limitation thereto, as other layers may also be present depending on the nature of the data storage device in which the magnetic-recording medium 400 might find use. For example, in various embodiments, the magnetic-recording layer 420 may include a single layer or multiple layers. Also, it should be noted that the magnetic-recording medium 400 may not be drawn to scale in FIG. 4; and, some layers that are generally known in the art and not necessary for the description herein may be omitted from FIG. 4 for clarity. According to an embodiment, the combined hydrogen and nitrogen implantation of HNICOC 430 may be accomplished using the embodiments of the method of FIG. 8, which are later described, and the apparatus of FIG. 1, by way of example without limitation thereto.

With further reference to FIG. 4, according to an embodiment, the structure of the top-surface layer 434 of the HNICOC 430 is shown. According to an embodiment, at least the HNICOC 430 excluding the top-surface layer 434 may include a diamond-like carbon (DLC) overcoat. According to an embodiment, the HNICOC 430 includes nitrogen implanted in a top-surface layer 434 of the HNICOC 430 such that a percentage ratio of a concentration of the implanted nitrogen to a concentration of carbon in the top-surface layer 434 of the HNICOC 430 is from about 30% to about 10% within a first depth of X, by way of example without limitation thereto, from about 2 Å to about 5 Å from the top surface 438. According to an embodiment, the percentage ratio of a concentration of the implanted nitrogen relative to a concentration of the carbon is not greater than about 10% at a second depth of Y, by way of example without limitation thereto, of about 10 Å from the top surface 438. According to an embodiment, the HNICOC 430 includes an effective amount of nitrogen implanted within the top-surface layer 434 of the HNICOC 430 extending from the top surface 438 to a depth from about 2 Å and about 5 Å sufficient to bond, by way of example without limitation thereto, a layer of lubricant (not shown), to the HNICOC 430. According to an embodiment, the HNICOC 430 further includes an amount of hydrogen implanted in the top-surface layer 434 of between about 1% to about 12% within a distance less than about 5 Å from the top surface. According to an embodiment, the amount of hydrogen implanted in the top-surface layer 434 of the HNICOC 430 is sufficient to inactivate a first fraction of active sites created by the implanted nitrogen. According to an embodiment, the amount of hydrogen implanted in the top-surface layer 434 of the HNICOC 430 may also inactivate a second fraction of dangling bonds in the top-surface layer 434 of the HNICOC 430 created by implantation of the nitrogen. Note that the first fraction of active sites created by the implanted nitrogen in the top-surface layer 434 may, or may not, be about equal to the second fraction of dangling bonds in the top-surface layer 434.

Figure 5:
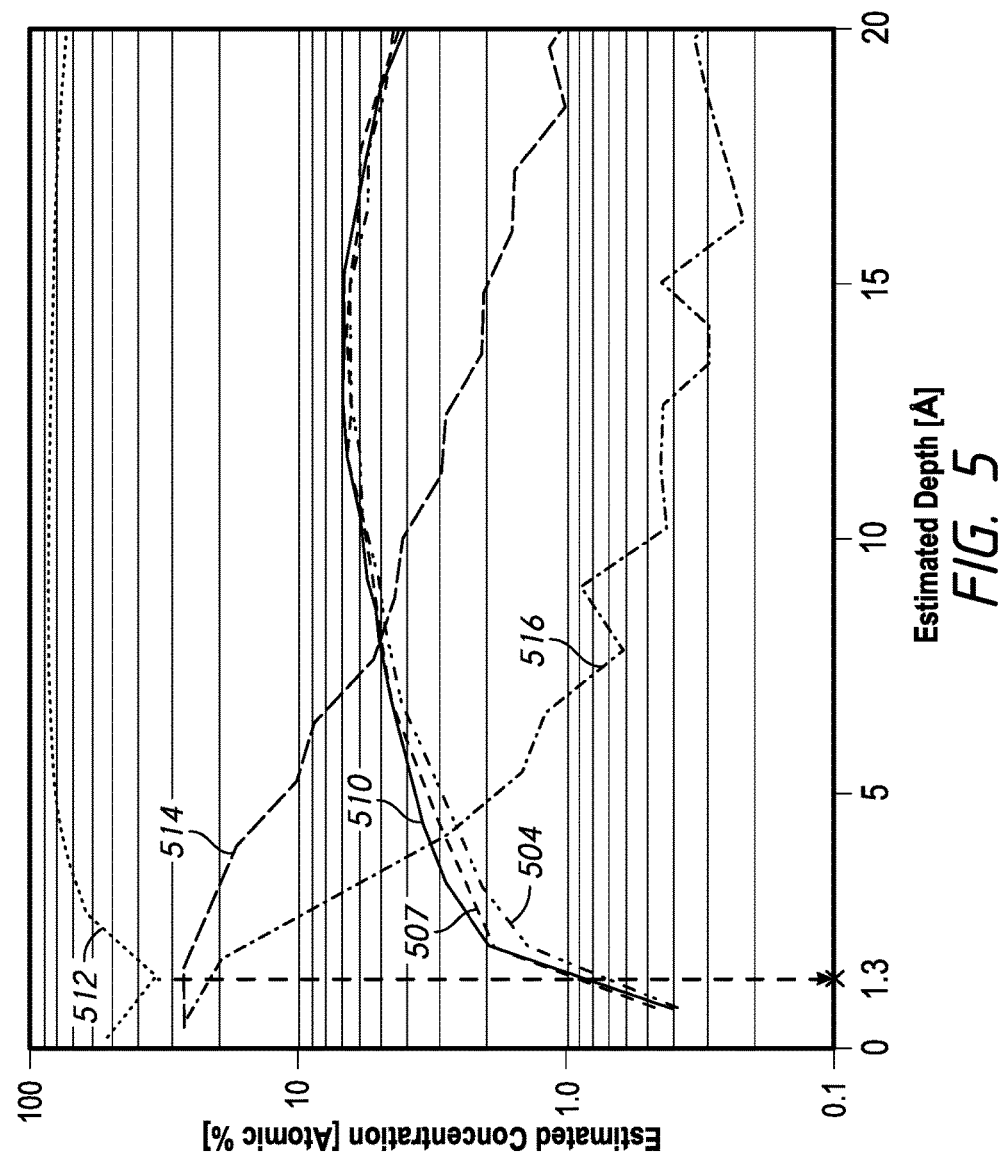
FIG. 5 shows depth profiles obtained with time-of-flight, secondary-ion, mass spectrometry (TOF-SIMS) of the distribution of constituents in the HNICOC produced by combined hydrogen and nitrogen implantation, according to an embodiment.
Figure 9:
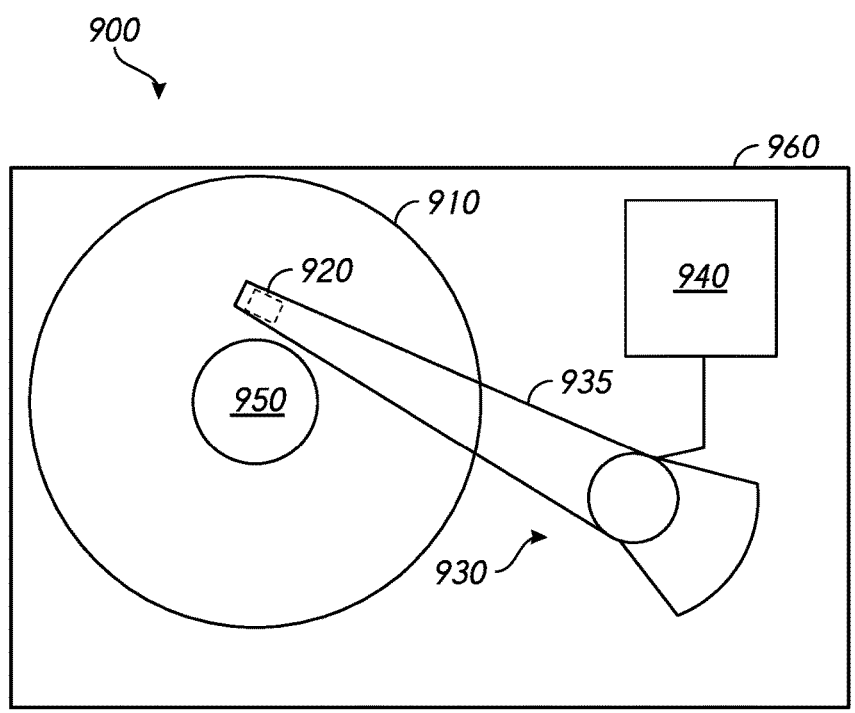
FIG. 9 is a schematic drawing of a data storage device, by way of example without limitation thereto, a disk drive, which includes a magnetic-recording disk including the magnetic-recording medium including the HNICOC produced by combined hydrogen and nitrogen implantation, according to an embodiment.

With reference now to FIGS. 5 and 9 and further reference to FIG. 4, according to an embodiment, depth profiles obtained with time-of-flight, secondary-ion, mass spectrometry (TOF-SIMS) are shown of the distribution of constituents in the HNICOC 430 produced by combined hydrogen and nitrogen implantation. For the example samples of FIG. 5, according to an embodiment, the following process conditions were employed: time duration of the implantation was about 1.5 sec; the total chamber pressure of combined $H_2$ and $N_2$ gases was about 50 milliTorr (mTorr); the total combined $H_2$ and $N_2$ gases' gas flow rate was about 600 sccm; the potential difference between the magnetic-recording medium and the plasma 155 was estimated to be about 40 Volts (V) with the magnetic-recording medium grounded; and, unlike the preceding conditions that applied to all samples, for each of the three different samples chosen for analysis the percentage ratios of the hydrogen gas flow rate to the total gas flow rate were 4%, 7% and 10%, respectively. As shown in FIG. 5, the distribution of the constituents, hydrogen, carbon, nitrogen and oxygen, are shown as respective plots that are known as depth profiles of the estimated concentration in units of atomic percent (At %) of each constituent as a function of estimated depth in units of Angstroms (Å) below a top surface of an unlubricated disk 910. The top surface of the disk 910 includes adventitiously adsorbed carbonaceous materials so that the top surface 438 of the HNICOC 430 begins at about the location in the dip in the depth profile 512 for carbon indicated by the arrow pointing to the abscissa at 1.3 Å depth, which is about 1 Å depth, as the adsorbed carbonaceous materials are expected to readily desorb from the top surface 438 of the HNICOC 430 after the initiation of TOF-SIMS depth profiling. TOF-SIMS is a microanalytical technique possessing both low detectability limits and high depth resolution. Depth profiles 504, 507 and 510 of hydrogen are shown in FIG. 5 for different respective percentage ratios of the hydrogen gas flow rate to the total gas flow rate of 4%, 7% and 10%. The depth profiles 504, 507 and 510 of hydrogen for different respective percentage ratios of the hydrogen gas flow rate to the total gas flow rate of 4%, 7% and 10% show that, as the percentage of hydrogen increases in the gas as determined by percentage ratio of the hydrogen gas flow rate to the total gas flow rate, the amount of hydrogen progressively increases in the top-surface layer 434 from about 2 Å to about 5 Å below the top surface 438 of the HNICOC 430, where a 1 Å depth offset for the adsorbed carbonaceous materials has been taken into account. Note that the depths at which the concentration of constituents for the depth profiles are described herein have been corrected for the depth offset due to the adsorbed carbonaceous materials. For example, the depth profile 504 of hydrogen corresponding to a percentage ratio of the hydrogen gas flow rate to the total gas flow rate of 4% shows a concentration of hydrogen in the top-surface layer 434 of the HNICOC 430 that varies from about 2.1 At % at a depth below the top surface 438 of about 2 Å to about 3.7 At % at a distance from the top surface 438 of about 5 Å. The depth profile 507 of hydrogen corresponding to a percentage ratio of the hydrogen gas flow rate to the total gas flow rate of 7% shows a concentration of hydrogen in the top-surface layer 434 of the HNICOC 430 that varies from about 2.4 At % at a depth below the top surface 438 of about 2 Å to about 4.2 At % at a distance from the top surface 438 of about 5 Å. The depth profile 510 of hydrogen corresponding to a percentage ratio of the hydrogen gas flow rate to the total gas flow rate of 10% shows a concentration of hydrogen in the top-surface layer 434 of the HNICOC 430 that varies from about 2.9 At % at a depth below the top surface 438 of about 2 Å to about 4.3 At % at a distance from the top surface 438 of about 5 Å.

Therefore, with further reference to FIGS. 5, 4 and 1, embodiments can provide different hydrogen content below the top surface 438 of the HNICOC 430 by controlling the percentage ratio of the hydrogen gas flow rate to the total gas flow rate during the combined hydrogen and nitrogen implantation of the top-surface layer 434 of HNICOC 430. Based on these hydrogen depth profiles, it was estimated that, for every 5% percentage ratio increase in the percentage ratio of the hydrogen gas flow rate to the total gas flow rate, the concentration of implanted hydrogen increases by about 1% in the top-surface layer 434 of the HNICOC 430 at a depth below the top surface 438 of about 2 Å. Therefore, for a range of percentage ratios of the hydrogen gas flow rate to the total gas flow rate from about 5% to about 30%, the concentration of implanted hydrogen would be expected to increase from about 1% to about 6% in the top-surface layer 434 of the HNICOC 430 at a depth below the top surface 438 of about 2 Å. Various process variables have been found to affect the concentration of implanted hydrogen, such as: principally, the percentage ratio of the hydrogen gas flow rate to the total gas flow rate, as described above, but also, the total gas pressure in the implantation chamber 110, the energy of the implantation determined by the potential difference between the magnetic-recording medium 400 and the plasma 155, and the time duration of the implantation. For example, an increase in the total gas pressure in the implantation chamber 110 would be expected to increase, the concentration of implanted hydrogen up to a limit determined at least by stability of the plasma 155. Moreover, the energy of the implantation affects the concentration of hydrogen as a function of depth below the top surface 438 of the HNICOC 430. Finally, by increasing the time duration of the combined hydrogen and nitrogen implantation, the concentration of implanted hydrogen would be expected to increase proportionately up to a limit determined at least by hydrogen saturation of the top-surface layer 434 of the HNICOC 430. Taking by way of example, the effect of increasing the time duration of the combined hydrogen and nitrogen implantation, by doubling the time duration of the combined hydrogen and nitrogen implantation, the concentration of implanted hydrogen would be expected to proportionately double so that, for the range of percentage ratios of the hydrogen gas flow rate to the total gas flow rate from about 5% to about 30%, the concentration of implanted hydrogen would be expected to proportionately double to from about 2% to about 12%, respectively, in the top-surface layer 434 of the HNICOC 430 at a depth below the top surface 438 of about 2 Å. Also, according to an embodiment, the concentration of nitrogen as a function of depth below the top surface 438 of the HNICOC 430 may be controlled by slightly increasing the time duration of the combined hydrogen and nitrogen implantation, for example, by 0.1 sec longer than the nominal 1.5 sec.

With further reference to FIGS. 5 and 4, according to an embodiment, the depth profiles 510, 512, 514 and 516 corresponding to the distribution of the constituents, hydrogen, carbon, nitrogen and oxygen, respectively, are shown for the HNICOC 430 produced by combined hydrogen and nitrogen implantation with a percentage ratio of the hydrogen gas flow rate to the total gas flow rate of 10%. As shown in FIG. 5, the depth profile 512 for carbon shows a concentration of carbon from about 70 At % to about 84 At % in the top-surface layer 434 from about 2 Å to about 5 Å, respectively, below the top surface 438 of the HNICOC 430. In like fashion, the depth profile 514 for nitrogen shows a concentration of nitrogen from about 20 At % to about 9 At % in the top-surface layer 434 from about 2 Å to about 5 Å, respectively, below the top surface 438 of the HNICOC 430. In like fashion, the depth profile 516 for oxygen shows a concentration of oxygen from about 5.4 At % to about 1.2 At % in the top-surface layer 434 from about 2 Å to about 5 Å, respectively, below the top surface 438 of the HNICOC 430. Therefore, the HNICOC 430 includes nitrogen implanted in a top-surface layer 434 of the HNICOC 430 such that the percentage ratio of the concentration of the implanted nitrogen to the concentration of carbon in the top-surface layer 434 of the HNICOC 430 is from about 28.5% to about 10.7%, so that the percentage ratio varies from about 30% to about 10%, within a first depth of from about 2 Å to about 5 Å, respectively, from the top surface 438. Also, the depth profile 510 of hydrogen shows a concentration of hydrogen of about 4.3 At % in the top-surface layer 434 at about 5 Å below the top surface 438 of the HNICOC 430.

With further reference to FIGS. 5 and 4, according to an embodiment, the behavior of the depth profiles 510, 512, 514 and 516 corresponding to the distribution of the constituents, hydrogen, carbon, nitrogen and oxygen, respectively, for the HNICOC 430 produced by combined hydrogen and nitrogen implantation with a percentage ratio of the hydrogen gas flow rate to the total gas flow rate of 10% is further described for depths of about 10 Å and greater below the top surface 438 of the HNICOC 430. As shown in FIG. 5, at about 10 Å below the top surface 438 of the HNICOC 430, the depth profile 512 for carbon shows a concentration of carbon of about 87 At %. At about 10 Å below the top surface 438 of the HNICOC 430, the depth profile 514 for nitrogen shows a concentration of nitrogen of about 3.0 At %. At about 10 Å below the top surface 438 of the HNICOC 430, the depth profile 516 for oxygen shows a concentration of oxygen of about 0.4 At %. Therefore, the percentage ratio of the concentration of the implanted nitrogen to the concentration of the carbon is about 3.4%, which is no greater than about 10%, at a second depth of about 10 Å from the top surface 438. As shown in FIG. 5, for depths greater than about 10 Å below the top surface 438 of the HNICOC 430, the depth profile 514 for nitrogen shows an approximately monotonically decreasing concentration of nitrogen, if statistical fluctuations are neglected, from the value of about 3.0 At % at about 10 Å. Also, as shown in FIG. 5, for depths greater than about 10 Å below the top surface 438 of the HNICOC 430, the depth profile 514 for carbon shows about a relatively constant concentration of carbon of from about 87 At % to about 74 At % between 10 Å and 19 Å, respectively. As the thickness of the HNICOC 430 is finite, and as the distribution of nitrogen is expected to continue to decrease with increasing depth below the top surface 438 in a HNICOC 430, initially deposited as a COC without nitrogen, the percentage ratio of the concentration of the implanted nitrogen to the concentration of the carbon is less than about 3.4%. This percentage ratio of 3.4% is no greater than about 10%, beyond a second depth of about 10 Å from the top surface 438 up to the bottom surface 439 of the HNICOC 430. Also, the depth profile 510 of hydrogen shows a concentration of hydrogen of about 6.5 At % in the top-surface layer 434 at about 10 Å below the top surface 438 of the HNICOC 430.

Figure 6:
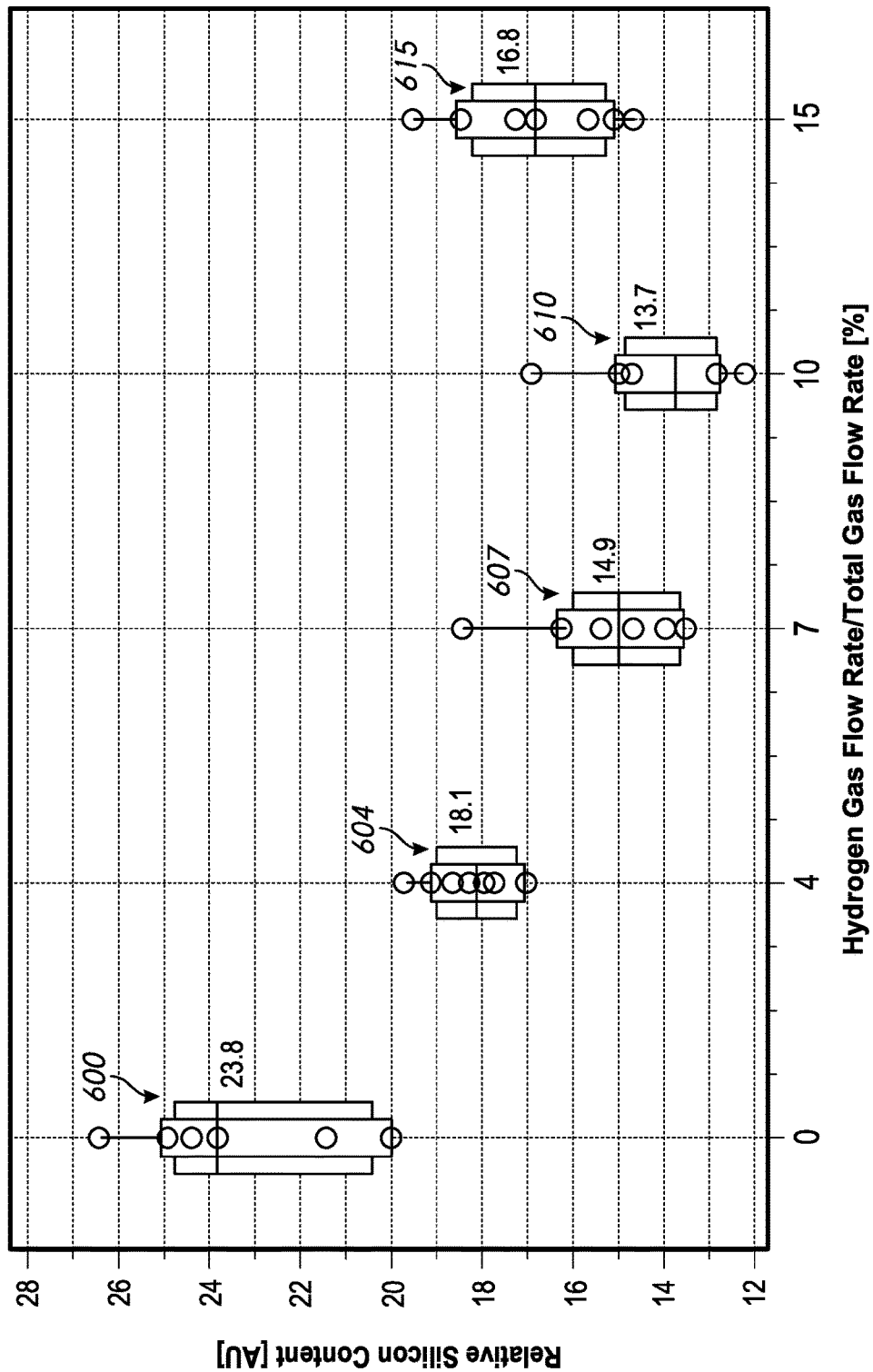
FIG. 6 shows the results of a silanes contamination test wherein the amount of silicon on the surface of the HNICOC was measured by TOF-SIMS as a function of the percentage ratio of a hydrogen gas flow rate to a total gas flow rate in the combined hydrogen and nitrogen implantation, according to an embodiment.

With reference now to FIG. 6 and further reference to FIG. 4, according to an embodiment, the results of a silanes contamination test are shown in which the amount of silanes was characterized by the amount of silicon found on the top surface 438 of the HNICOC 430 and the top surface 238 of a NICOC 230, which was prepared by the conventional nitrogen-implantation process without hydrogen additions to the gas. The amount of silicon found on the top surface 438 of the HNICOC 430 was measured by TOF-SIMS as a function of the percentage ratios of the hydrogen gas flow rate to the total gas flow rate of the combined hydrogen and nitrogen implantation. As shown in FIG. 6, respective box-and-whisker plots 600, 604, 607, 610 and 615 of measurements of the amount of silicon in arbitrary units (AU) that was found by TOF-SIMS are shown for different respective percentage ratios of the hydrogen gas flow rate to the total gas flow rate of 0%, 4%, 7%, 10% and 15%. The respective median values of measurements of the amount of silicon that was found by TOF-SIMS for the respective box-and-whisker plots 600, 604, 607, 610 and 615 were 23.8 AU, 18.1 AU, 14.9 AU, 13.7 AU and 16.8 AU, respectively, for the different respective percentage ratios of the hydrogen gas flow rate to the total gas flow rate of 0%, 4%, 7%, 10% and 15%. As seen in FIG. 6, the upper end-points of the whiskers of the box-and-whisker plots 604, 607, 610 and 615 for the different respective percentage ratios of the hydrogen gas flow rate to the total gas flow rate of 4%, 7%, 10% and 15% all lie below the lower end-point of the whisker of the box-and-whisker plot 600 for the conventional nitrogen-implantation process without hydrogen additions at a percentage ratio of the hydrogen gas flow rate to the total gas flow rate of 0%, which indicates that the addition of hydrogen to the gas is significant in lowering the amount of silicon that was found on the top surface 438 of the HNICOC 430 by TOF-SIMS. Note that the amount of silicon found by TOF-SIMS is indicative of the amount of surface contamination by silanes for the silanes contamination test. Therefore, the box-and-whisker plots 604, 607, 610 and 615 of measurements of the amount of silicon for different respective percentage ratios of the hydrogen gas flow rate to the total gas flow rate of 4%, 7%, 10% and 15% show that, with the addition of hydrogen to the gas as determined by the percentage ratios of the hydrogen gas flow rate to the total gas flow rate, the amount of silicon is reduced at the top surface 438 of the HNICOC 430 when compared to the amount of silicon corresponding to box-and-whisker plot 600 found on the top surface 238 of the NICOC 230. As shown in FIG. 5, based on the concentrations of silicon shown therein, the reduction in the amount of silanes was inferred to be greatest at a percentage ratio of the hydrogen gas flow rate to the total gas flow rate of 10% corresponding to box-and-whisker plot 610.

With further reference to FIGS. 6 and 4, according to an embodiment, the silanes contamination test results discussed above demonstrate that the combined hydrogen and nitrogen implantation can reduce the amount of silanes contamination on the top surface 438 of the HNICOC 430 when compared with the top surface 238 of the NICOC 230. Correspondingly, according to an embodiment, the HNICOC 430 includes an amount of hydrogen implanted in the top-surface layer 434 of the HNICOC 430 that is sufficient to inhibit contamination from contaminants in an environment. According to an embodiment, the contaminants may be environmental organic contaminants (EOCs). In particular, according to an embodiment, the contaminants may include compounds, which behave similar to silanes in their surface mobility and surface adsorption proclivity, selected from the group consisting of silanes, silanols, siloxanes, organosilanes, organosiloxanes, heterosilanes, heterosiloxanes, organosilicon compounds and other silicon-containing compounds that have similar surface behavior to silanes. As used herein, silanes designate compounds selected from the homologous series of compounds that have the formula $Si_nH_{n+2}$. Moreover, according to an embodiment, hydrogen implanted in the top-surface layer 434 of the HNICOC 430 can terminate active sites, such as, dangling bonds, in the top-surface layer 434 by preventing these active sites from bonding with contaminants in the environment, which is next described further.

Figure 7:
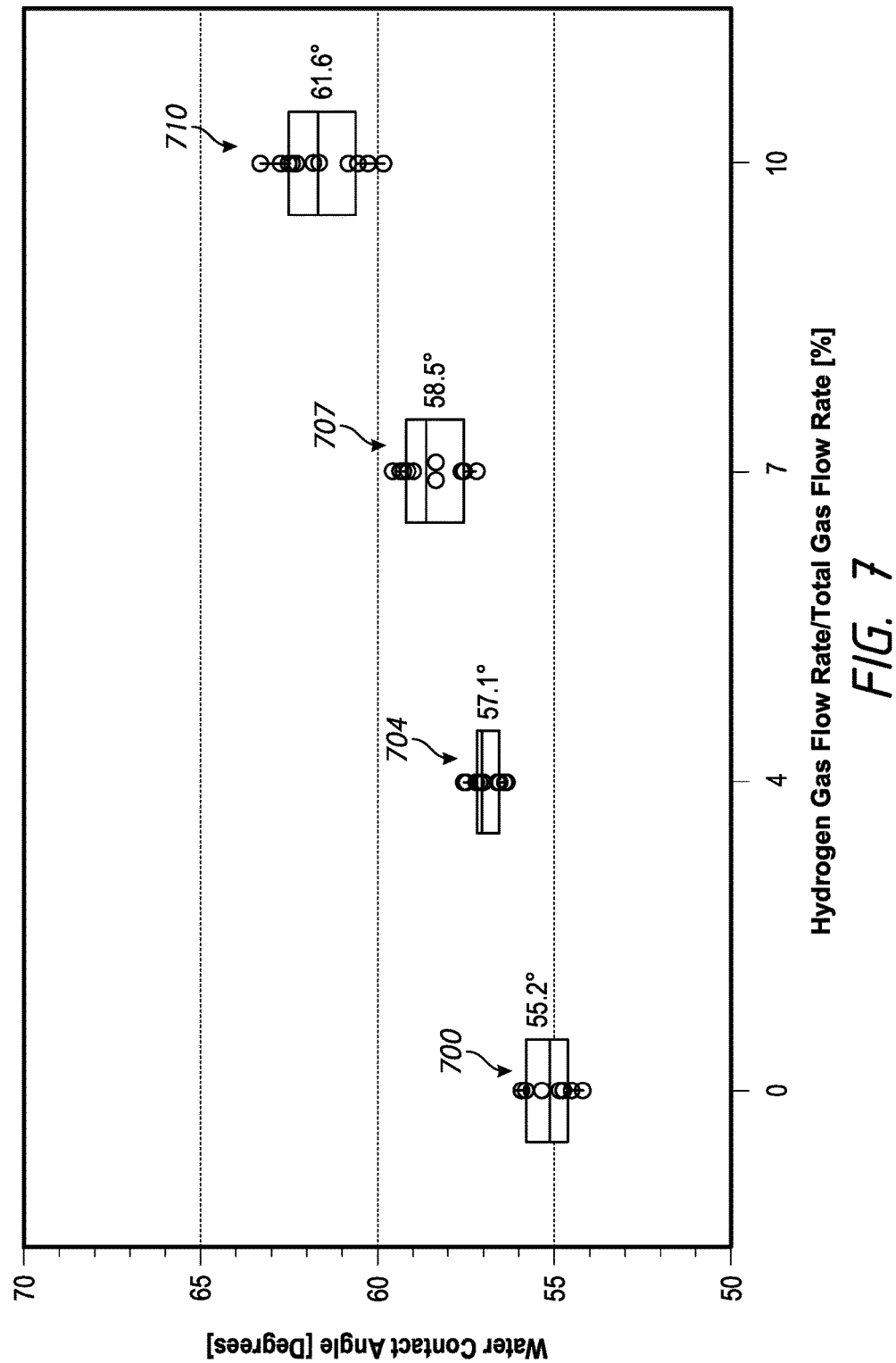
FIG. 7 shows the results of a water contact-angle test wherein the wettability of the surface of the HNICOC was measured as a function of the percentage ratio of the hydrogen gas flow rate to the total gas flow rate in the combined hydrogen and nitrogen implantation, according to an embodiment.

With reference now to FIG. 7 and further reference to FIG. 4, according to an embodiment, the results of a water contact-angle test are shown. The wettability of the top surface 438 of the HNICOC 430 and the top surface of a NICOC 230, which was prepared by the conventional nitrogen-implantation process without hydrogen additions to the gas, was measured as a function of the percentage ratio of the hydrogen gas flow rate to the total gas flow rate. The contact angles were measured on magnetic-recording disks that had been lubricated with a layer of lubricant providing about 70% coverage of the top surface 438 of the HNICOC 430 and about 70% coverage of the top surface 238 of the NICOC 230. As shown in FIG. 7, respective box-and-whisker plots 700, 704, 707 and 710 of measurements of the water contact-angle in degrees (°) are shown for different respective percentage ratios of the hydrogen gas flow rate to the total gas flow rate of 0%, 4%, 7%, and 10%. The respective median values of measurements of the water contact-angle for the respective box-and-whisker plots 700, 704, 707 and 710 were 55.2°, 57.1°, 58.5° and 61.6°, respectively, for the different respective percentage ratios of the hydrogen gas flow rate to the total gas flow rate of 0%, 4%, 7%, and 10%. Therefore, the box-and-whisker plots 704, 707 and 710 of measurements of the water contact-angle for different respective percentage ratios of the hydrogen gas flow rate to the total gas flow rate of 4%, 7% and 10% show that, with the addition of hydrogen to the gas as determined by percentage ratios of the hydrogen gas flow rate to the total gas flow rate, wettability of the top surface 438 of the HNICOC 430 is reduced when compared to the wettability of the top surface 238 of the NICOC 230 corresponding to box-and-whisker plot 700. As shown in FIG. 5, the reduction in wettability of the top surface 438 of the HNICOC 430 is most at a percentage ratio of the hydrogen gas flow rate to the total gas flow rate of 10% corresponding to box-and-whisker plot 710.

With further reference to FIGS. 7 and 4, according to an embodiment, the wettability test results discussed above demonstrate that the combined hydrogen and nitrogen implantation can reduce the wettability of the top surface 438 of the HNICOC 430 when compared with the top surface 238 of the NICOC 230. As wettability is measure of the activity of a surface to bond to materials disposed thereon, the loss of wettability is evidence that the combined hydrogen and nitrogen implantation has reduced the number of active sites available for bonding, associated with dangling bonds, in proximity to the top surface 438 of the HNICOC 430 when compared with the top surface 238 of the NICOC 230. Correspondingly, according to an embodiment, the HNICOC 430 includes an amount of hydrogen implanted in the top-surface layer 434 of the HNICOC 430 that is sufficient to inactivate a first fraction of active sites created by the implanted nitrogen. Similarly, according to an embodiment, the amount of hydrogen implanted in the top-surface layer 434 of the HNICOC 430 inactivates a second fraction of dangling bonds in the top-surface layer 434 of the HNICOC 430 created by implantation of the nitrogen.

Figure 8:
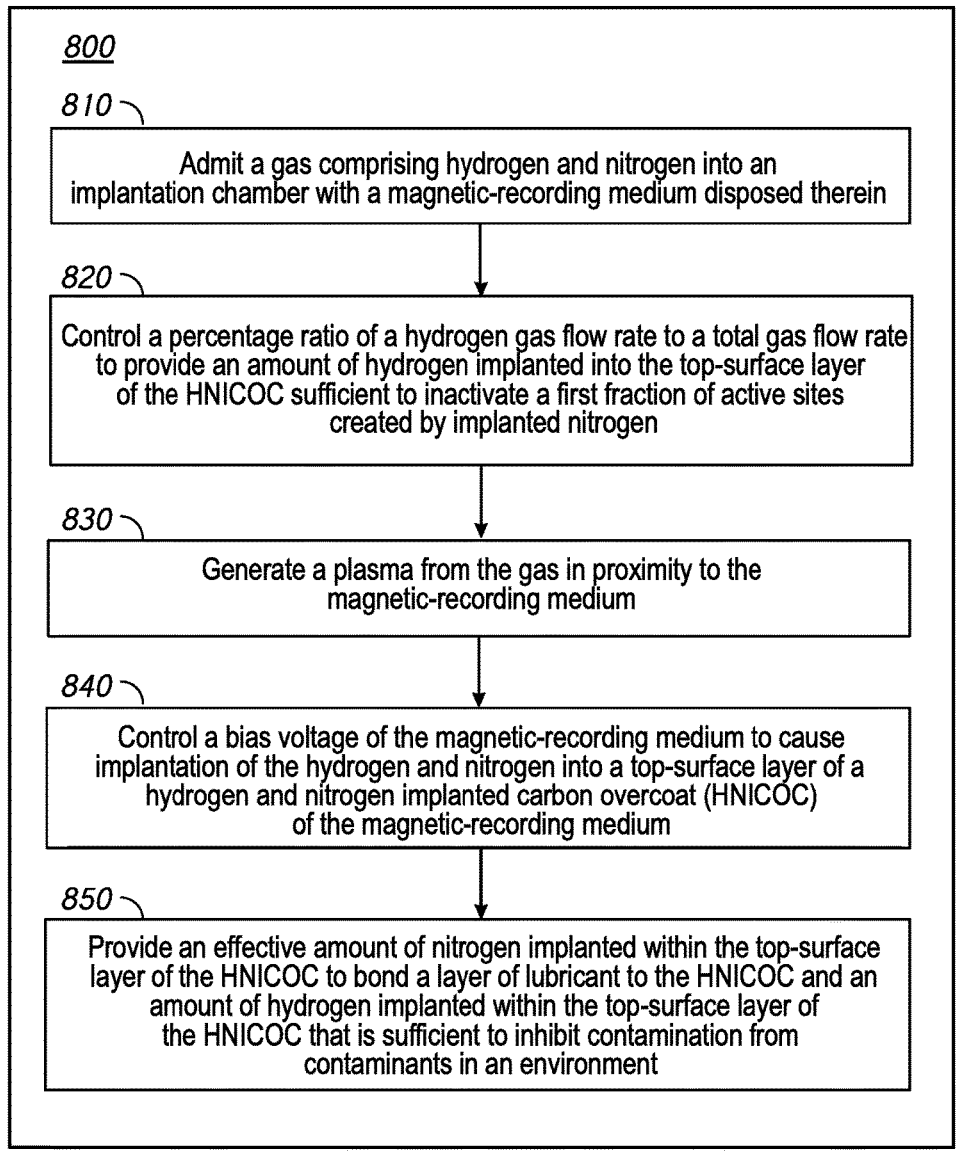
FIG. 8 is a flow chart of a method, according to an embodiment, for treating a magnetic-recording medium with the combined hydrogen and nitrogen implantation to prevent contamination from contaminants in an environment.

With reference now to FIG. 8 and further reference to FIGS. 1, 3 and 4, according to an embodiment, a flow chart 800 of a method is shown for treating the magnetic-recording medium 400 with the combined hydrogen and nitrogen implantation that prevents contamination from contaminants in the environment. According to an embodiment, the method of flow chart 800 includes the following operations. At 810, the gas including hydrogen and nitrogen is admitted into the implantation chamber 110 with the magnetic-recording medium 400 disposed therein. At 820, the percentage ratio of the hydrogen gas flow rate to the total gas flow rate is controlled to provide an amount of hydrogen implanted into the top-surface layer 434 of HNICOC 430 sufficient to inactivate the first fraction of active sites created by the implanted nitrogen. According to an embodiment, the percentage ratio of the hydrogen gas flow rate to the total gas flow rate, recited in operation 820, may be between about 2% and about 20%. According to an embodiment, the percentage ratio of the hydrogen gas flow rate to the total gas flow rate, recited in operation 820, may be about 10%. With regard to operation 820, it will be recognized that few, if any, active sites are expected to be present in the HNICOC 430 until implantation has begun so that controlling the percentage ratio of the hydrogen gas flow rate to the total gas flow rate implies, according to one example embodiment, adjusting and/or selecting a given percentage ratio value of the hydrogen gas flow rate to the total gas flow rate, before the implantation commences with generating a plasma at operation 830, to provide an amount of hydrogen implanted into the top-surface layer 434 of HNICOC 430 sufficient to inactivate the first fraction of active sites created by the implanted nitrogen, until sometime after the implantation commences with generating a plasma at operation 830. Moreover, the particular order in which operation 820 appears in the flow chart 800, is by way of example without limitation thereto, as for another embodiment, operation 820 might be performed on-the fly as operation 830 commences, or even during operation 830, because the order of the operations in the flow chart 800 is by way of example only, not categorically implying a fixed order. At 830, the plasma 155 is generated from the gas in proximity to the magnetic-recording medium 400. According to an embodiment, the radio frequency (RF) power may be applied to the pair of electrodes 120A and 120B to generate the plasma 155, recited in operation 830, from the gas. According to an embodiment, the power level of the RF power may be between about 50 Watts and about 500 Watts. According to an embodiment, the magnetic-recording medium 400 may be disposed between the pair of electrodes 120A and 120B including the first electrode 120A and the second electrode 120B that are positioned at opposite sides of the magnetic-recording medium 400.

With further reference to FIGS. 1, 4 and 8, at 840, the bias voltage of the magnetic-recording medium 400 is controlled to cause implantation of the hydrogen and the nitrogen into the top-surface layer 434 of the HNICOC 430 of the magnetic-recording medium 400. Note that, prior to implantation, the layer labeled as HNICOC 430 in FIG. 3 is typically an unimplanted COC before transformation of the unimplanted COC into the HNICOC 430 by combined hydrogen and nitrogen implantation. According to an embodiment, at least the HNICOC 430, recited in operation 840, excluding the top-surface layer 434 implanted with nitrogen, may include a diamond-like carbon (DLC) overcoat. According to an embodiment, the controlling the bias voltage, recited in operation 840, may include applying a voltage between about −100 volts and about 100 volts to the magnetic-recording medium 400. According to an embodiment, the controlling the bias voltage, recited in operation 840, may also include disconnecting the bias-voltage power supply (P/S) 140 from electrical communication with the magnetic-recording medium 400 such that the magnetic-recording medium 400 is in a floating state. At 850, an effective amount of nitrogen implanted within the top-surface layer 434 of the HNICOC 430 is provided to bond the layer of lubricant to the HNICOC 430; and, an amount of hydrogen implanted within the top-surface layer 434 of the HNICOC 430 is provided that is sufficient to inhibit contamination from contaminants in the environment. According to an embodiment, the contaminants, recited in operation 850, may be environmental organic contaminants (EOCs). In particular, according to an embodiment, the contaminants may include compounds, which behave similar to silanes in their surface mobility and surface adsorption proclivity, selected from the group consisting of silanes, silanols, siloxanes, organosilanes, organosiloxanes, heterosilanes, heterosiloxanes, organosilicon compounds and other silicon-containing compounds that have similar surface behavior to silanes.

With reference now to FIG. 9 and further reference to FIG. 4, according to an embodiment, a schematic drawing is shown of the data storage device 900, by way of example without limitation thereto, a disk drive. According to an embodiment, the magnetic-recording medium 400 is incorporated into the magnetic-recording disk 910, and therefore, data storage device 900. According to an embodiment, the data storage device 900 includes at least one magnetic-recording disk 910 and at least one slider 920 associated therewith. According to an embodiment, the magnetic-recording disk 910 includes the magnetic-recording medium 400 that includes the HNICOC 430 produced by combined hydrogen and nitrogen implantation. The magnetic-recording disk 910 resides on a spindle assembly 950 that is mounted in a drive housing 960. Data may be stored in a magnetic-recording layer 420 along tracks of the magnetic-recording disk 910. According to an embodiment, the slider 920 includes a magnetic-recording head that is operable to store, as well as to retrieve, such data. According to an embodiment, the slider 920 is operable to fly over the magnetic-recording disk 910 to reach a track where data is to be stored and/or retrieved. According to an embodiment, the magnetic-recording head includes a write element and a read element. The write element is operable to write information to the magnetic-recording disk 910 in a track where data is to be stored; and, the read element is operable to read information from the magnetic-recording disk 910 from a track where data has been stored. According to an embodiment, slider 920 is disposed at the distal end of an actuator arm 935 of an actuator 930. The radial position of the slider 920 relative to the magnetic-recording disk 910 may be controlled by position control circuitry 940, which controls the actuator 930 and, thereby, the radial position of the actuator arm 935 and slider 920 over a particular track of the magnetic-recording disk 910. The data storage device 900 also includes a spindle motor (not shown) that rotates the spindle assembly 950 and, thereby, the magnetic-recording disk 910 to position a portion of the track under the slider 920 at a particular circumferential location where information is to be recorded on, or retrieved from, the magnetic-recording disk 910. According to an embodiment, the data storage device 900 may be, by way of example without limitation thereto, a hard-disk drive (HDD) that includes the various components of the data storage device 900 described above. Although only a single magnetic-recording disk 910 and a single slider 920 are shown in FIG. 9, the data storage device 900 may include a plurality of magnetic-recording disks 910 and a plurality of sliders 920, and corresponding pluralities of matching components, as described above, to store and/or retrieve data. Also, other components of the data storage device 900 that are generally known in the art and not necessary for understanding FIG. 9, have been omitted for conciseness and clarity from the drawing of FIG. 9 and the preceding description, but may be considered to be within the scope of embodiments.

With further reference to FIGS. 1, 4, 8 and 9, according to an embodiment, the method for treating the magnetic-recording medium 400 with the combined hydrogen and nitrogen implantation utilizing dual RF-powered electrodes 120A and 120B may be used to perform combined hydrogenation and nitrogenation of the magnetic-recording medium 400 using an apparatus 100 in accordance with the combined hydrogen and nitrogen implantation process similar to that shown in FIG. 1. A gas including hydrogen and nitrogen is provided between the magnetic-recording medium 400 and the pair of electrodes 120A and 120B (see FIG. 1), such that the pair of electrodes 120A and 120B includes a first electrode 120A and a second electrode 120B positioned at opposite sides of the magnetic-recording medium 400 that may be incorporated in, by way of example without limitation thereto, the magnetic-recording disk 910. The controller 150 is provided to control the bias voltage of the magnetic-recording medium 400. According to an embodiment, RF-power may be applied to the pair of electrodes 120A and 120B thereby generating the plasma 155 from gas admitted to the implantation chamber 110 to cause implantation of both the hydrogen and the nitrogen into the HNICOC 430 on both sides of the magnetic-recording medium 400. According to an embodiment, the magnetic-recording medium 400 including two sides (see FIG. 1) may include a single substrate 410 with magnetic-recording layers, similar to the magnetic-recording layer 430, and HNICOCs, similar to the HNICOCs 430A and 430B, disposed symmetrically on opposite sides of the substrate 410. According to an embodiment, the magnetic-recording disk 910 with two sides may include the magnetic-recording medium 400 with two sides.

It is to be understood that the specific order or hierarchy of actions in the methods disclosed is an illustration of example processes. Based upon design preferences, it is understood that the specific order or hierarchy of actions in the method may be rearranged. The accompanying method claims present elements of the various actions in a sample order, and are not meant to be limited to the specific order or hierarchy presented unless specifically recited therein.

It shall be appreciated by those skilled in the art in view of the present disclosure that although various example fabrication methods are discussed herein with reference to a magnetic-recording medium, the methods, with or without some modifications, may be used for fabricating other types of magnetic-recording media, for example, magnetic-recording tape. Moreover, although various example fabrication methods are discussed herein with reference to magnetic-recording disks, the methods, with or without some modifications, may be used for fabricating other types of recording disks, for example, optical recording disks such as a compact disc (CD) and a digital-versatile-disk (DVD), or magneto-optical recording disks, or ferroelectric data storage devices.

While the above description contains many specific embodiments, these should not be construed as limitations that limit the scope of embodiments, but rather as examples thereof. Accordingly, the scope of the embodiments described herein should be determined not by the embodiments illustrated, but by the appended claims and their equivalents.

The various features and processes described above may be used independently of one another, or may be combined in various ways. All possible combinations and sub-combinations are intended to fall within the scope of this disclosure. In addition, certain method, event, state or process blocks may be omitted in some implementations. The methods and processes described herein are also not limited to any particular sequence, and the blocks or states relating thereto can be performed in other sequences. For example, described tasks or events may be performed in an order other than that specifically disclosed, or multiple tasks or events may be combined in a single block or state. The example tasks or events may be performed in serial, in parallel, or in some other manner. Tasks or events may be added to or removed from the disclosed example embodiments. The example systems and components described herein may be configured differently than described. For example, elements may be added to, removed from, or rearranged compared to the disclosed example embodiments.

What is claimed is:

1. A magnetic-recording medium comprising:
   a substrate;
   a magnetic-recording layer disposed on the substrate; and
   a hydrogen and nitrogen implanted carbon overcoat (HNICOC) disposed on the magnetic-recording layer;
   wherein the HNICOC consists of a single layer;
   wherein the HNICOC comprises nitrogen implanted in a top-surface area of the HNICOC such that a percentage ratio of a concentration of the implanted nitrogen to a concentration of carbon in the top-surface area of the HNICOC is between about 30 percent (%) to about 10% within a depth from about 2 Ångstrom (Å) to about 5 Å from the top surface of the HNICOC;
   wherein the HNICOC comprises an amount of hydrogen implanted in the top-surface area between about 1 atomic % to 12 atomic % within a distance less than about 5 Å from the top-surface of the HNICOC; and
   wherein the HNICOC comprises an unimplanted COC area below the top-surface area.

2. The magnetic-recording medium of claim 1, wherein the HNICOC comprises nitrogen implanted in the top-surface area of the HNICOC such that the percentage ratio of the concentration of the implanted nitrogen to the concentration of carbon in the top-surface area of the HNICOC varies from about 30% to about 10% within a depth from about 2 Å to about 5 Å, respectively from the top surface.

3. The magnetic-recording medium of claim 1, wherein the percentage ratio of the concentration of the implanted nitrogen to the concentration of the carbon is not greater than about 10% at a depth of about 10 Å from the top surface.

4. The magnetic-recording medium of claim 1, wherein the HNICOC comprises an amount of hydrogen implanted in the top-surface area of the HNICOC that is sufficient to inactivate a first fraction of active sites created by the implanted nitrogen.

5. The magnetic-recording medium of claim 1, wherein the HNICOC comprises an amount of hydrogen implanted in the top-surface area of the HNICOC that is sufficient to inhibit contamination from contaminants in a magnetic recording environment.

6. The magnetic-recording medium of claim 5, wherein the contaminants are environmental organic contaminants (EOCs).

7. The magnetic-recording medium of claim 5, wherein the contaminants comprise compounds selected from the group consisting of silanes, silanols, siloxanes, organasilanes, organaosiloxanes, heterosilanes, hetereosiloxanes, organaosilicon compounds and other silicon-containing compounds.

8. The magnetic-recording medium of claim 1, wherein at least the unimplanted COC area comprises a diamond-like carbon (DLC) overcoat.

9. The magnetic-recording medium of claim 1, wherein the HNICOC comprises an effective amount of nitrogen implanted within the top-surface area of the HNICOC extending from the top surface to a depth from about 2 Å to about 5 Å sufficient to bond a layer of lubricant to the HNICOC.

10. The magnetic-recording medium of claim 1, wherein the amount of hydrogen implanted in the top-surface area of the HNICOC inactivates a second fraction of dangling bonds in the top-surface area of the HNICOC created by implantation of the nitrogen.

11. A magnetic-recording disk including the magnetic-recording medium of claim 1.

12. A data storage device, comprising:
   a magnetic-recording disk including the magnetic-recording medium of claim 1;
   a slider operable to fly over the magnetic-recording disk; and
   a magnetic-recording head disposed on the slider, wherein the magnetic-recording head includes:
      a write element operable to write information to the magnetic-recording disk; and
      a read element operable to read information from the magnetic-recording disk.

13. The magnetic-recording medium of claim 12, wherein the data storage device comprises a hard-disk drive (HDD).

14. The magnetic-recording medium of claim 1, wherein the unimplanted COC area is directly below the top-surface area.

* * * * *